(12) United States Patent  
Edelstein et al.

(10) Patent No.: US 8,497,202 B1  
(45) Date of Patent: Jul. 30, 2013

(54) INTERCONNECT STRUCTURES AND METHODS OF MANUFACTURING OF INTERCONNECT STRUCTURES

(75) Inventors: Daniel C. Edelstein, White Plains, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/400,610

(22) Filed: Feb. 21, 2012

(51) Int. Cl.  
*H01L 21/4763* (2006.01)

(52) U.S. Cl.  
USPC .................. 438/618; 438/597; 257/E21.585

(58) Field of Classification Search  
USPC ............................ 438/597, 618; 257/E21.585  
See application file for complete search history.

(56) References Cited

U.S. PATENT DOCUMENTS

| | | | |
|---|---|---|---|
| 5,391,517 A * | 2/1995 | Gelatos et al. | 438/643 |
| 5,552,341 A * | 9/1996 | Lee | 438/643 |
| 6,077,780 A | 6/2000 | Dubin | |
| 6,181,012 B1 * | 1/2001 | Edelstein et al. | 257/762 |
| 6,204,179 B1 * | 3/2001 | McTeer | 438/687 |
| 6,387,805 B2 | 5/2002 | Ding et al. | |
| 6,426,293 B1 * | 7/2002 | Wang et al. | 438/687 |
| 6,756,302 B1 * | 6/2004 | Shan et al. | 438/653 |
| 6,893,541 B2 | 5/2005 | Chiang et al. | |
| 7,341,945 B2 * | 3/2008 | Yamamoto | 438/687 |
| 2005/0167830 A1 | 8/2005 | Chang et al. | |

FOREIGN PATENT DOCUMENTS

CN          101740420 A    6/2010

\* cited by examiner

*Primary Examiner* — Alexander Ghyka  
*Assistant Examiner* — Stanetta Isaac  
(74) *Attorney, Agent, or Firm* — Catherine Ivers; Roberts Mlotkowski Safran & Cole, P.C.

(57) ABSTRACT

Interconnect structures and methods of manufacturing the same are disclosed herein. The method includes forming a barrier layer within a structure and forming an alloy metal on the barrier layer. The method further includes forming a pure metal on the alloy metal, and reflowing the pure metal such that the pure metal migrates to a bottom of the structure, while the alloy metal prevents exposure of the barrier layer. The method further includes completely filling in the structure with additional metal.

16 Claims, 5 Drawing Sheets

INTERCONNECT STRUCTURES AND METHODS OF MANUFACTURING OF INTERCONNECT STRUCTURES

FIELD OF THE INVENTION

The invention relates to semiconductor structures and methods of manufacture and, more particularly, to interconnect structures and methods of manufacturing the same.

BACKGROUND

As device dimensions shrink, it becomes difficult to fill trenches and vias with copper in a damascene copper interconnect process. For example, copper can be used to fill a high aspect ratio trench/via through a migration process. That is, it is known that copper migrates at a much lower temperature than its melting point when the copper film has a thickness less than a few nanometers. This copper migration tends to accumulate at the bottom of the trench and/or via due to the so-called capillary phenomenon. More specifically, by utilizing this phenomenon, small trenches and/or vias are filled by: (1) deposition of ultra thin copper films (e.g., as thin as less than a few nanometers), and (2) heating the wafers at temperatures as low as 200° C. to 400° C. At these temperatures, the ultra thin copper films migrate to the bottom of the trenches and/or vias to partially fill the features from the bottom side. Since the actual aspect ratio which needs to be filled with a subsequent plating of copper becomes low, it becomes easier to fill such high aspect ratio features with copper plating.

However, due to the migration of the copper atoms at the interface of the underlying materials, e.g., diffusion barrier metals such as TaN and Ta, formed on sidewalls, the underlying materials become exposed, which makes subsequent electroplating of copper difficult. This is because it is difficult for the copper to adhere to the underlying exposed materials, e.g., TaN and Ta. Also, it is known that the migration of copper causes agglomeration of copper at the sidewalls of the trench/via which, in turn, forms isolated islands. These isolated islands, though, do not migrate to the bottom of the trench/via features because of the lost capillary phenomenon. It is also known that these agglomerated copper islands make it difficult for filling of the trenches and/or vias with electroplated copper. In other words, the low temperature migration of copper atoms which takes place when the copper film is ultra thin causes both agglomeration and migration of copper at the same time, which results in processing concerns.

More specifically, in conventional processes, after trench/via pattern definition, a liner of copper seed is formed along the sidewall of the trench/via before electroplating of copper. In the conventional process, when copper is heated for reflow, copper islands are formed due to the dewetting of the liner surface (i.e., disconnected flow of copper down to the bottom of the trench/via features). A resultant void is thus formed after the copper electroplating. Also, from the dewetted liner surface, no electroplating takes place, or early pinch off of the trench entrance occurs due to the copper island formation. In this latter situation, voids will remain in the trench/via features.

Accordingly, there exists a need in the art to overcome the deficiencies and limitations described hereinabove.

SUMMARY

In a first aspect of the invention, a method comprises forming a barrier layer within a structure and forming an alloy metal on the barrier layer. The method further comprises forming a pure metal on the alloy metal, and reflowing the pure metal such that the pure metal migrates to a bottom of the structure, while the alloy metal prevents exposure of the barrier layer. The method further comprises completely filling in the structure with additional metal.

In another aspect of the invention, a method of forming an interconnect structure comprises forming a structure through an interlevel dielectric. The method further comprises forming a barrier layer on sidewalls of the structure and forming a copper alloy seed layer on the barrier layer. The method further comprises forming a pure copper film layer on the barrier layer. The method further comprises reflowing the pure copper film layer such that the pure copper film layer migrates into a bottom of the structure, while the copper alloy layer wets the barrier layer due to adhesion. The method further comprises filling the structure with an electroplated copper, directly on the reflowed pure copper, and capping the structure with a dielectric material.

In another aspect of the invention, a structure comprises a barrier layer on sidewalls of a via and trench structure. A copper alloy seed layer is on the barrier layer. A pure copper film layer is on the barrier layer and migrates to a bottom of the via and trench structure. An electroplated copper fills in remaining portions of the via and trench structure, directly on the reflowed pure copper. A dielectric material capping is provided over the filled via and trench structure.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the interconnect structures, which comprises the structures of the present invention. In still further embodiments, a method in a computer-aided design system is provided for generating a functional design model of the interconnect structures. The method comprises generating a functional representation of the structural elements of the tunable filter structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention. Unless otherwise specified herein, the drawings are not to scale.

DETAILED DESCRIPTION

The invention relates to semiconductor structures and methods of manufacture and, more particularly, to interconnect structures and methods of manufacturing the same. In embodiments, the interconnect structures of the present invention include an improved liner surface, which prevents exposure of underlying barrier metals during a reheating or reflow process. The methods of the present invention thus prevent formation of voids, formation of agglomerated copper islands and pinch-off of the high aspect trenches and/or vias. Advantageously, copper (Cu) interconnect reliability, especially electromigration performance, is drastically improved by implementations of the present invention.

More specifically, in embodiments of the present invention, high aspect ratio trenches and/or vias are filled with a seed layer of copper comprising a copper alloy layer and a pure copper layer. The high aspect ratio trenches and/or vias can then be filled with reflowed copper and electroplated copper, without void formation or agglomeration. In embodiments, an optional additional copper alloy layer can also be provided over the pure copper layer, prior to electroplating copper processes. In implementation, the copper alloy layer ensures that a wet liner surface remains during the reflowing process, and is maintained during subsequent deposition processes. In this way, the interfacial barrier layer is not exposed during heating processes, thereby avoiding the formation of voids and other processing issues.

Figure 1:
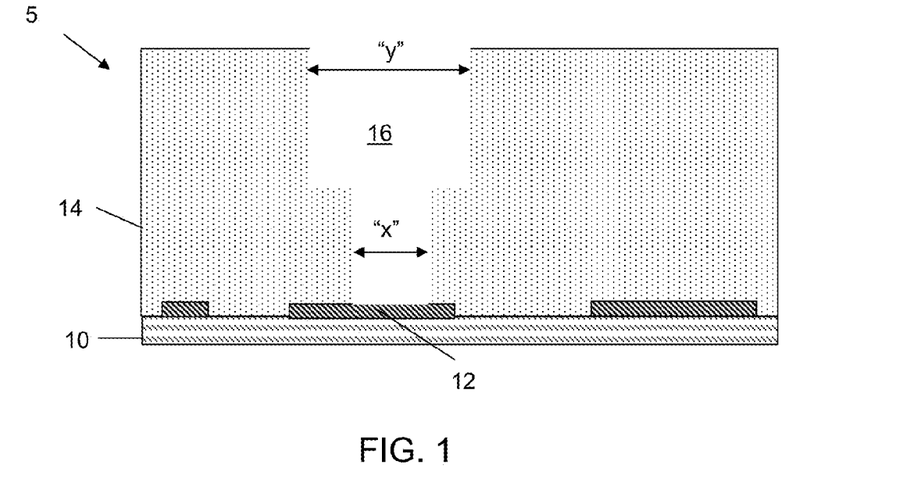
FIGS. 1-5 show fabrication processes and respective structures for fabricating an interconnect structure in accordance with aspects of the present invention.

FIGS. 1-5 show fabrication processes and respective structures for fabricating an interconnect structure in accordance with aspects of the present invention. More specifically, FIG. 1 shows a structure 5 comprising wiring 12 formed on a substrate 10. In embodiments, the wiring 12 can be formed from any wiring material such as, for example, copper. The wiring 12 can be formed using any additive or subtractive metal processes known to those of skill in the art. For example, in one non-limiting illustrative example, a metal (e.g., copper) can be deposited on the substrate 10 using conventional deposition processes such as, for example, a chemical vapor deposition (CVD) process. The metal can then be patterned using conventional photolithographic and etching processes, e.g., reactive ion etching, known to those of skill in the art.

An interlevel dielectric material 14 is deposited on the wiring 12 and exposed portions of the substrate 10. In embodiments, the interlevel dielectric material 14 can be an oxide, formed using conventional CVD processes. A high aspect ratio via and trench structure 16 is formed in the interlevel dielectric material 14, using any conventional photolithographic and etching processes. For example, the high aspect ratio via and trench structure 16 can be formed using a conventional dual damascene process. In embodiments, the high aspect ratio via and trench structure 16 exposes an underlying wiring 12.

In embodiments, the via portion of the structure 16 can have a cross dimensional size "X" of about 20 nm to about 50 nm, with a preference of about 30 nm; although other dimensions are also contemplated by the present invention. In further embodiments, the trench portion of the structure 16 can have a cross dimensional size "Y" of about 3 microns; although other dimensions are also contemplated by the present invention.

Figure 2:
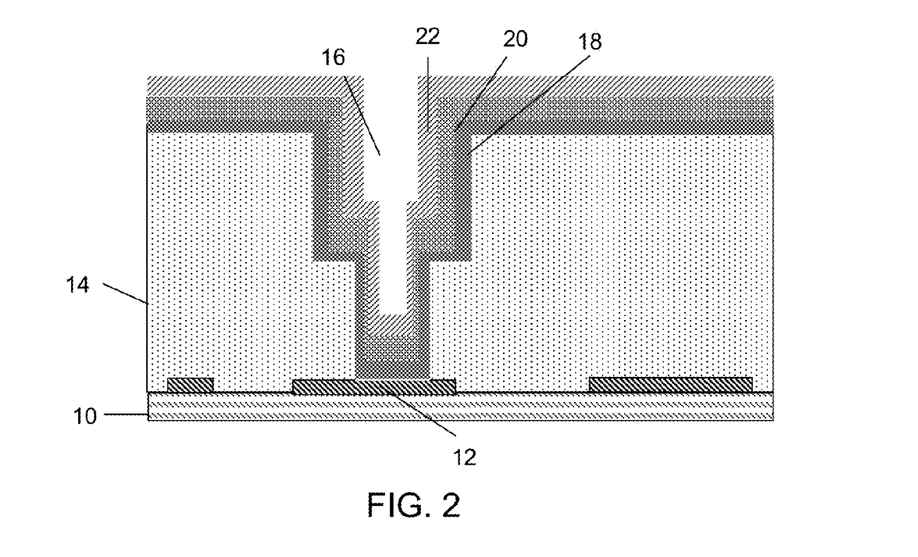

FIG. 2 shows additional processing steps and a respective structure in accordance with aspects of the present invention. In particular, a barrier metal 18 is deposited within the high aspect ratio via and trench structure 16 and top surface of the interlevel dielectric layer 14. In embodiments, the barrier metal 18 can be Ta, deposited using a conventional plasma vapor deposition (PVD) process. In alternate embodiments, the barrier metal 18 can be TaN, deposited using a conventional atomic layer deposition (ALD) process. In still further embodiments, the barrier metal 18 can be a combination of TaN and Ta, deposited using a conventional CVD process; although, PVD or ALD processes are also contemplated by the present invention. In still further embodiments, the barrier metal 18 can be any combination of TaN, Ta, Ru, Co or alloys thereof, deposited using a CVD or PVD process. The thickness of the barrier metal can vary, with a preference for about 2 nm to about 5 nm; although other dimensions are also contemplated by the present invention.

Still referring to FIG. 2, a bilayer of a copper alloy seed layer 20 and pure copper film layer 22 is then formed on the barrier metal 18. More specifically, the copper alloy seed layer 20 is deposited on the barrier metal 18, within the high aspect ratio via and trench structure 16 (and other exposed areas, in embodiments). The copper alloy seed layer 20 can be, for example, CuAl, CuMn, CuTi or CuSn, deposited using a CVD process. As should be understood by those of skill in the art, the copper alloy seed layer 20 exhibits strong adhesion and improved wetting properties to the underlying barrier materials (e.g., TaN, Ta, Ru, Co, etc.). The copper alloy seed layer 20 can have a thickness of about 10 nm; although other dimensions are also contemplated by the present invention.

The pure copper film layer 22 is then deposited on the copper alloy seed layer 20. The pure copper film layer 22 can have a thickness of about 10 nm; although other dimensions are also contemplated by the present invention. Preferably, the pure copper film layer 22 can be formed without breaking the vacuum, from the previous deposition process.

Figure 3:
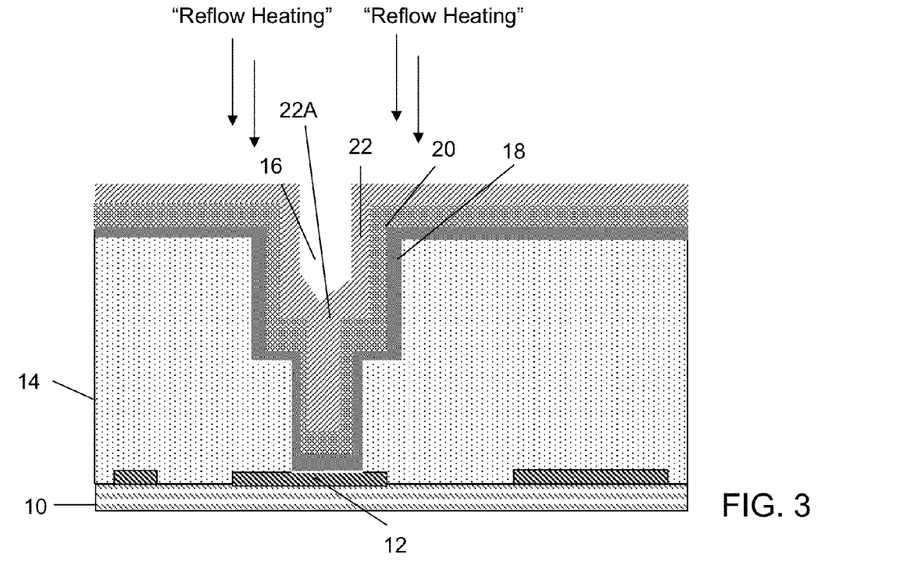

In FIG. 3, the bilayer of copper alloy seed layer 20 and pure copper film layer 22 then undergoes a heating or reflow process, which causes migration of copper to the bottom of the structure 16, as represented by reference numeral 22A. In embodiments, the heating can range from about 200° C. to about 375° C. Advantageously, during the heating process, the copper alloy seed layer 20 (e.g., wetting layer) always keeps the liner surface (e.g., barrier metal 18) wet with copper, while the pure copper film layer 22 is allowed to flow into the bottom region of the structure 16 (also known as reflowing). That is, as should be understood by those of skill in the art, during the heating process the copper alloy seed layer 20 prevents exposure of the underlying barrier materials to the impurity-containing vacuum ambient, due to its strong adhesion to the underlying materials; whereas, the pure copper film layer 22 shows surface migration to the bottom of the structure 16 as shown by reference numeral 22A. Thus, as the surface of the underlying barrier metal 18 remains wet with copper (without any portions being exposed), formation of isolated copper islands (e.g., agglomeration) is prevented, resulting in ideal copper redistribution for perfect filling of the structure 16, with additional copper in later processing steps. Also, the strong adhesion properties to the underlying metal barrier metals leads to excellent electromigration performance of the interconnect structure.

Figure 4:
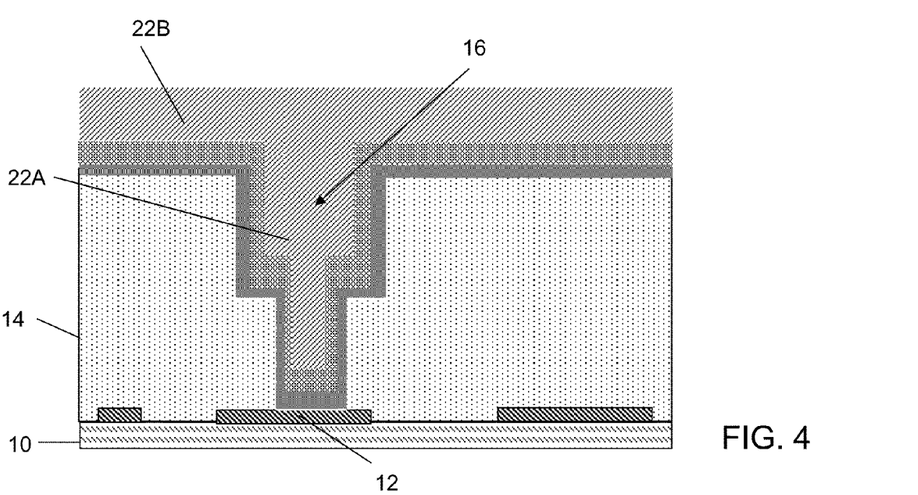

In FIG. 4, an electroplating process is provided to completely fill the structure 16 with additional copper 22B. As shown in FIG. 4, the copper electroplating does not form any voids, thus resulting in a perfect filling of the structure, with the additional copper.

Figure 5:
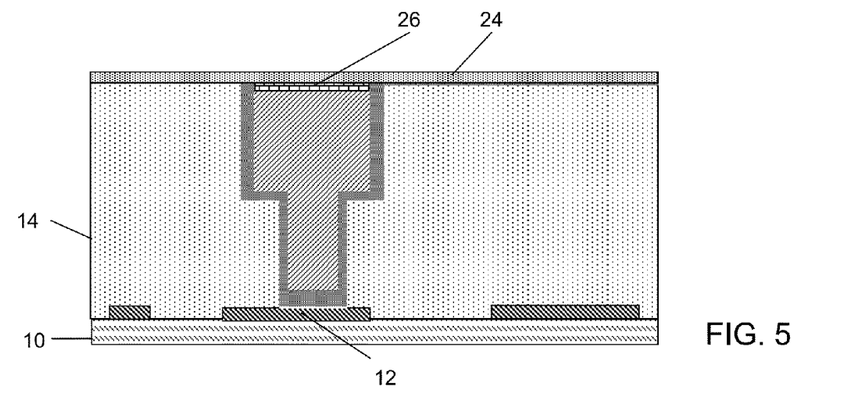

As shown in FIG. 5, the structure then undergoes a chemical mechanical polish (CMP), to remove the layers (e.g., layers 18, 20, 22 and 22B) from the top surface of the interlevel dielectric layer 14. Thereafter, a dielectric layer 24 is formed on the planarized surface, to form a capping layer. In embodiments, the dielectric layer 24 can be, for example, SiN or SiNC, formed using conventional CVD processes.

After dielectric cap deposition and, in some case, after annealing of the copper lines after CMP, impurities in the copper alloy layer (e.g., Mn, Ti, etc.) redistribute to segregate at the top surface of the copper (e.g., layer 26), which improves the electromigration reliability of the copper interconnects, e.g., by preventing void formation. Thus, the resultant copper interconnect exhibits high reliability without having voids and with segregated alloy impurity atoms 26 at the copper surface, i.e., between the copper 22 and the dielectric layer 24.

Figure 6:
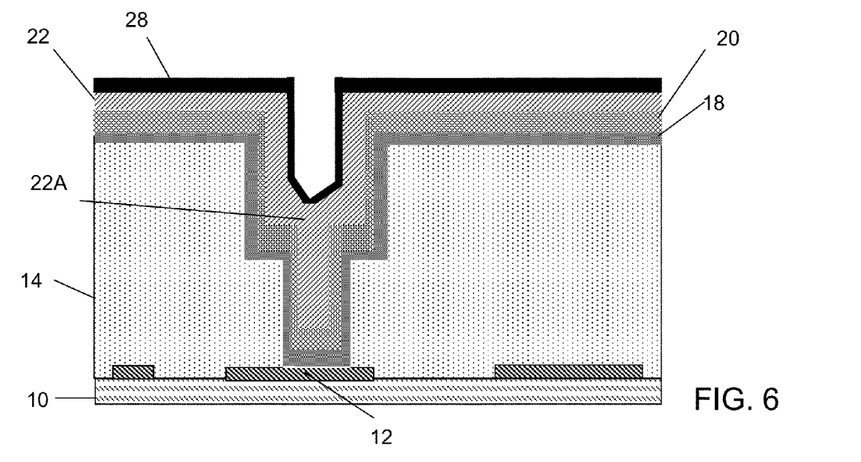
FIGS. 6-8 show alternate fabrication processes and respective structures for fabricating an interconnect structure in accordance with aspects of the present invention.
Figure 7:
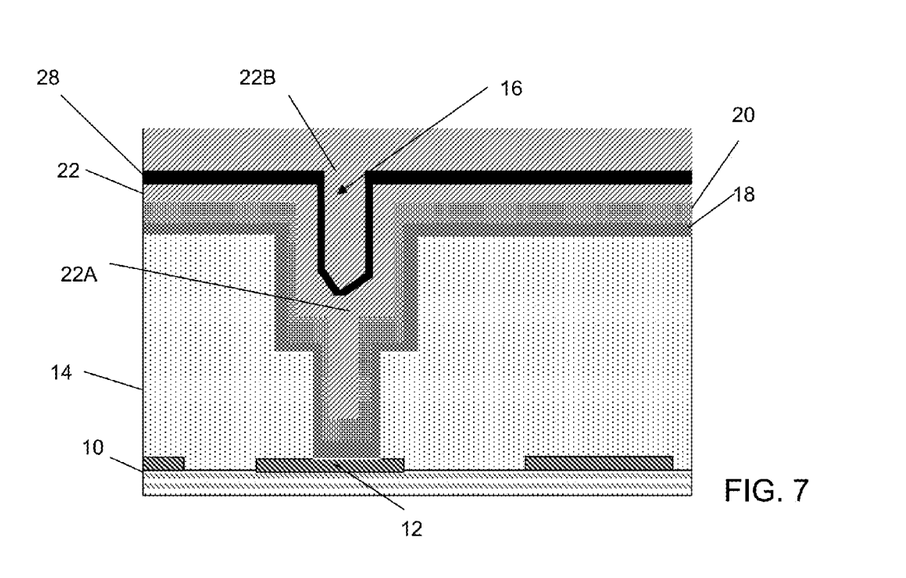
Figure 8:
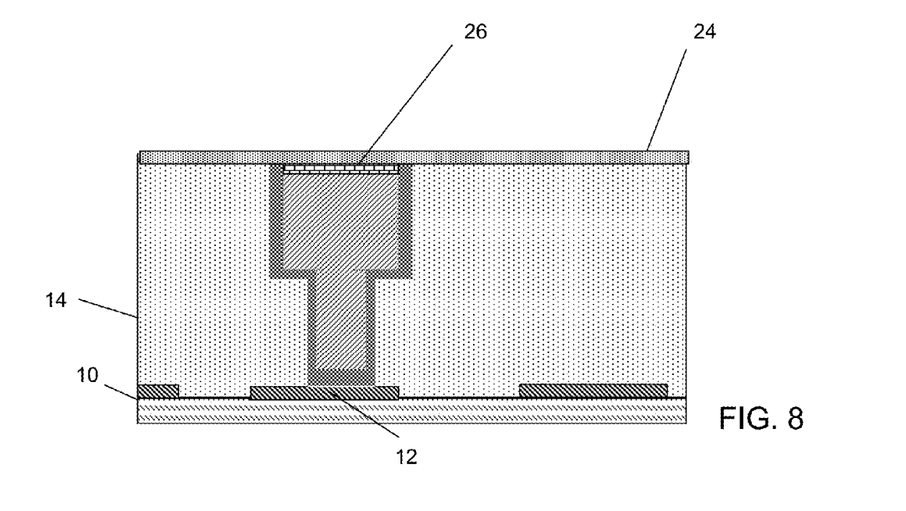

FIGS. 6-8 show alternate fabrication processes and respective structures for fabricating an interconnect structure in accordance with aspects of the present invention. More particularly, starting from the structure of FIG. 3, in FIG. 6, an additional copper alloy layer 28 is formed on the pure copper film layer 22 and reflow copper 22A. In embodiments, the additional copper alloy layer 28 can be formed from the same materials or combinations thereof and using the same processes as that of the copper alloy layer 22. In further embodiments, the additional copper alloy layer 28 should preferably be thinner than the copper alloy layer 22, e.g., on the order of about 5 nm; although other dimensions are also contemplated by the present invention. In embodiments, the additional copper alloy layer 28 will lead to additional segregation of impurity atoms, resulting in increased electromigration performance of the interconnect structure.

In FIG. 7, an electroplating process is then provided to completely fill the structure 16 with additional copper 22B. As shown in FIG. 7, the copper electroplating does not form any voids, thus resulting in a perfect filling of the structure, with the additional copper.

As shown in FIG. 8, the structure then undergoes a chemical mechanical polish (CMP), to remove the layers (e.g., layers 18, 20, 22, 22B and 28) from the top surface of the interlevel dielectric layer 14. Thereafter, a dielectric layer 24 is formed on the planarized surface, to form a capping layer. As described above, after dielectric cap deposition and, in some case, after annealing of the copper lines after CMP, impurities in the copper alloy layer (e.g., Mn, Ti, etc.) redistribute to segregate at the top surface of the copper (e.g., layer 26), which improves the electromigration reliability of the copper interconnects. The impurities of the additional copper alloy layer also diffuse to the top of the copper layer, i.e., layer 26.

Also, it should be understood by those of skill in the art, that the steps of the depositing of the pure copper deposition and the heating can be repeated for multiple times without exposure of the underlying materials (e.g., TaN, Ta Ru, Co), in any of the aspects of the present invention. This is because of the presence of the copper alloy layer interfacing to the underlying materials. This repetition of the sequence gradually decreases the actual aspect ratio of the features for easier filling of the features (e.g., structure 16) with copper by electroplating. Also, the processes of the present invention can be provided in an in-situ vacuum thermal cycle or ex-situ reducing-ambient thermal cycle, which will render low-thermal-budget full-fill Cu damascene with appropriate alloy concentration.

Figure 9:
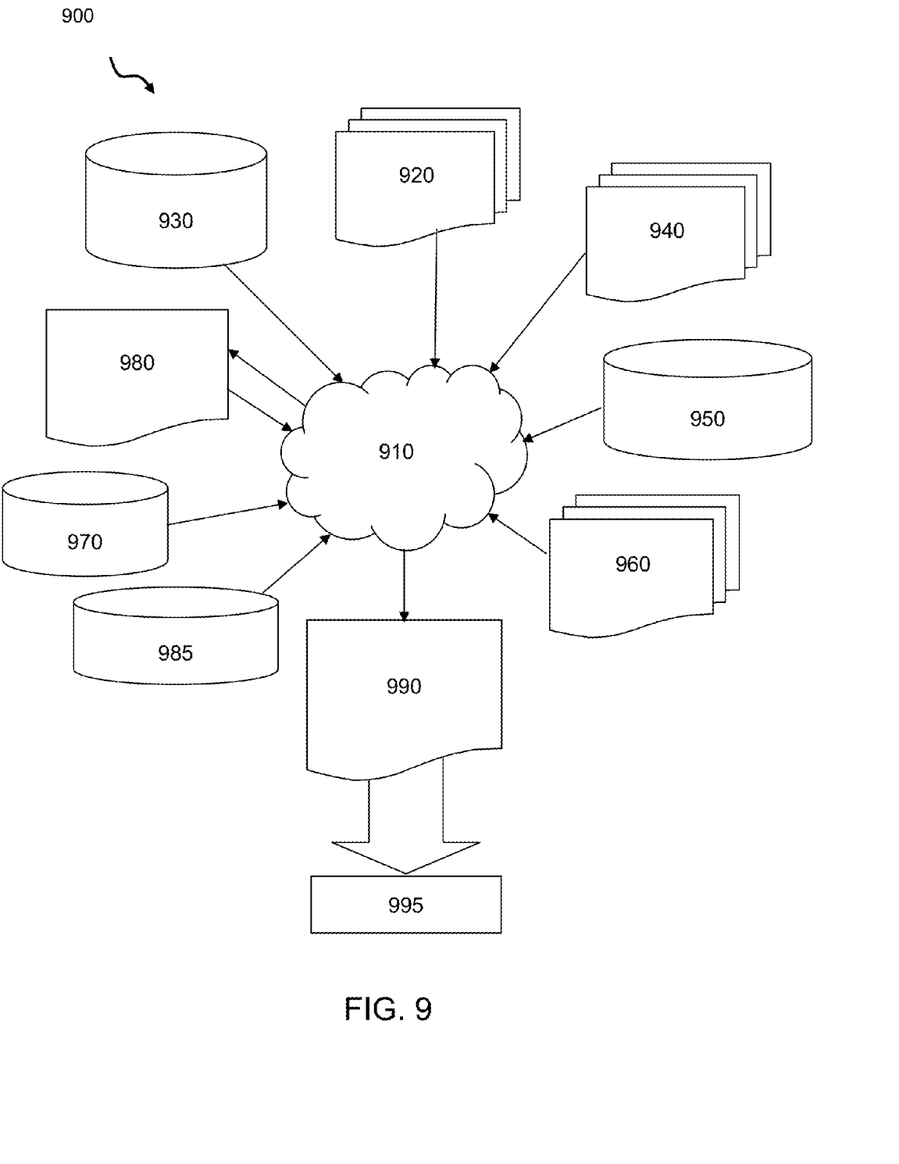
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming a barrier layer within a structure;
   forming an alloy metal on the barrier layer;
   forming a pure metal on the alloy metal;
   reflowing the pure metal such that the pure metal migrates to a bottom of the structure, while the alloy metal prevents exposure of the barrier layer;
   completely filling in the structure with additional metal; and
   comprising forming a layer of metal alloy on the pure metal, after the reflowing and prior to the filling in the structure.

2. The method of claim 1, wherein the alloy metal is a copper alloy.

3. The method of claim 2, wherein the pure metal is pure copper.

4. The method of claim 3, wherein the completely filling in the structure comprises electroplating copper within structure, over the pure copper.

5. The method of claim 2, wherein the metal alloy is one of CuAl, CuMn, CuTi and CuSn.

6. The method of claim 2, wherein the copper alloy wets the barrier layer during reflowing.

7. The method of claim 6, wherein the reflowing causes copper migration to the bottom of the structure without forming voids or agglomeration of copper islands.

8. The method of claim 1, wherein the structure is a trench and via structure formed in an interlevel dielectric material using a dual damascene process.

9. The method of claim 1, wherein the barrier layer is a Ta based material using a combination of TaN and Ta, Ru, Co or alloys thereof.

10. The method of claim 1, further comprising forming a dielectric cap over the filled structure, which forms a film of segregated alloy impurity atoms on a surface of the additional metal which is electroplated copper.

11. A method of forming an interconnect structure, comprising:
- forming a structure through an interlevel dielectric;
- forming a barrier layer on sidewalls of the structure;
- forming a copper alloy seed layer on the barrier layer;
- forming a pure copper film layer on the barrier layer;
- reflowing the pure copper film layer such that the pure copper film layer migrates into a bottom of the structure, while the copper alloy layer wets the barrier layer due to adhesion;
- filling the structure with an electroplated copper, directly on the reflowed pure copper;
- capping the structure with a dielectric material; and
- forming a layer of copper alloy on the pure copper, after the reflowing and prior to the filling in the structure.

12. The method of claim 11, wherein the copper alloy is CuAl, CuM, CuTi or CuSn, which forms a film of impurities on a surface of the electroplated copper.

13. The method of claim 12, wherein the impurities are Al, Mn, Ti or Sn.

14. The method of claim 12, wherein the film prevents void formation.

15. The method of claim 11, wherein the barrier layer is Ta based material using any combination of TaN and Ta, Ru, Co or alloys thereof.

16. The method of claim 11, wherein the copper alloy is thicker than the layer of copper alloy.

\* \* \* \* \*